US012747514B2

(12) United States Patent
Ko et al.

(10) Patent No.: US 12,747,514 B2
(45) **Date of Patent: *Sep. 29, 2026**

(54) METHOD FOR PREPARING CREMATION CRYSTALS USING CATALYST OBTAINED THROUGH REDUCTION OF PHOSPHORUS IN SKELETAL REMAINS

(71) Applicant: Mi Kyung Ko, Jeju-si (KR)

(72) Inventors: Mi Kyung Ko, Jeju-si (KR); Se Ho Boo, Jeju-si (KR); Dae Hoon Kim, Incheon (KR)

(73) Assignee: Mi Kyung Ko, Jeju-si (KR)

( * ) Notice: Subject to any disclaimer, the term of this patent is extended or adjusted under 35 U.S.C. 154(b) by 331 days.

This patent is subject to a terminal disclaimer.

(21) Appl. No.: 18/575,373

(22) PCT Filed: Jul. 6, 2022

(86) PCT No.: PCT/KR2022/009722

§ 371 (c)(1),
(2) Date: Dec. 29, 2023

(87) PCT Pub. No.: WO2023/282606

PCT Pub. Date: Jan. 12, 2023

(65) Prior Publication Data

US 2024/0309539 A1 Sep. 19, 2024

(30) Foreign Application Priority Data

Jul. 7, 2021 (KR) ........................ 10-2021-0089294

(51) Int. Cl.
*C30B 9/04* (2006.01)
*B01J 27/16* (2006.01)
(Continued)

(52) U.S. Cl.
CPC ............. *C30B 11/003* (2013.01); *B01J 27/16* (2013.01); *C04B 35/62204* (2013.01);
(Continued)

(58) Field of Classification Search
CPC .... C30B 9/00; C30B 9/04; C30B 9/06; C30B 9/08; C30B 11/00; C30B 11/003;
(Continued)

(56) References Cited

U.S. PATENT DOCUMENTS 258,423 A * 5/1882 Hughes et al. ......... C01B 25/20 423/317
2025/0100882 A1* 3/2025 Ko ...................... C04B 35/6306

FOREIGN PATENT DOCUMENTS

KR 10-2012-0129879 A 11/2012
KR 20120128786 A * 11/2012 ........... C04B 18/067
(Continued)

*Primary Examiner* — Kenneth A Bratland, Jr.

(57) ABSTRACT

Proposed is a method of forming cremation crystals, which is specifically a method of forming cremation crystals by using H3PO4 as a catalyst in a heat treatment process of ashes, thus preventing the ashes from being damaged by volatilization and enabling the crystals to be formed more efficiently. More specifically, proposed is a method of forming cremation crystals by mixing ashes with phosphoric acid obtained through the reduction of phosphorus in skeletal remains, which enables the cremation crystals composed purely of skeletal remains to be provided without additionally introducing other additives, thus satisfying the needs of families or guardians of the deceased desiring to keep cremation crystals composed purely of ashes, and enables both the color and transparency of ultimately formed cremation crystals to be achieved through a single formation process without limitation, thus satisfying the aesthetic needs of consumers and being easily applicable to all kinds of jewelry.

1 Claim, 6 Drawing Sheets

(51) Int. Cl.
*C04B 35/622* (2006.01)
*C04B 35/626* (2006.01)
*C04B 35/653* (2006.01)
*C30B 11/00* (2006.01)

(52) U.S. Cl.
CPC .... *C04B 35/6261* (2013.01); *C04B 35/62655* (2013.01); *C04B 35/653* (2013.01); *B01J 2523/51* (2013.01)

(58) Field of Classification Search
CPC . C30B 11/04; C30B 11/08; B01J 27/16; B01J 2523/51; C04B 35/62204; C04B 35/6261; C04B 35/62655; C04B 35/653
USPC ................................ 117/11, 73, 76, 78, 937
See application file for complete search history.

(56) References Cited

FOREIGN PATENT DOCUMENTS

KR 10-2013-0082462 A 7/2013
KR 10-2013-0090503 B1 8/2013
KR 10-2018-0059214 A 6/2018

* cited by examiner

METHOD FOR PREPARING CREMATION CRYSTALS USING CATALYST OBTAINED THROUGH REDUCTION OF PHOSPHORUS IN SKELETAL REMAINS

CROSS-REFERENCE TO RELATED APPLICATIONS

This application claims the benefit under 35 U.S.C. section 371, of PCT International Application No. PCT/KR2022/009722, filed on Jul. 6, 2022, which claims foreign priority to Korean Patent Application No. KR 10-2021-0089294, filed on Jul. 7, 2021, in the Korean Intellectual Property Office, both of which are hereby incorporated by reference in their entireties.

TECHNICAL FIELD

The present disclosure relates to a method of forming cremation crystals and, specifically, to a method of forming cremation crystals by using phosphoric acid ($H_3PO_4$) as a catalyst in a heat treatment process of ashes, thus preventing the ashes from being damaged due to volatilization and enabling the crystals to be formed more efficiently. More specifically, the present disclosure relates to a method of forming cremation crystals by mixing ashes with phosphoric acid obtained through the reduction of phosphorus in skeletal remains, which enables the cremation crystals composed purely of skeletal remains to be provided without additionally introducing other additives, thus satisfying the needs of families or guardians of the deceased desiring to keep cremation crystals composed purely of the ashes of deceased people or companion animals, and enables both the color and transparency of ultimately formed cremation crystals to be achieved through a single formation process without limitation, thus satisfying the aesthetic needs of consumers and being easily applied to all kinds of jewelry.

BACKGROUND ART

While burial has traditionally been the main method of burying the dead in Korea, each grave takes up an average of about 49.6 $m^2$. Statistics show that in Korea, an area of land equivalent to half the size of Jeju Island is being used for cemeteries. Additionally, graves are usually located in remote areas or mountains and are thus quite challenging to manage. These burial customs do not fit the circumstances of Korea, where available land is small, and the value of land continues to rise. Additionally, the social perception of funeral customs has significantly changed as modern society, as a whole, has become more westernized and nuclearized. Therefore, these burial customs have faded and are gradually replaced with cremation. On the one hand, as the culture of raising companion animals continues to develop, there is a growing trend of holding a funeral upon the death of a companion animal through cremation, similar to the practice of human funerals.

On the other hand, skeletal remains remaining after cremation are typically ground and placed in a cremation urn in the form of powdered bones to be stored in a charnel house or outdoor cemetery constructed with stone structures and the like. In this case, the skeletal remains are burnt at high temperatures and thus form a porous structure where a large number of micropores are formed, thereby obtaining extremely strong adsorption properties. Therefore, during storage, moisture, foreign substances, bacteria, and the like are observed to be strongly absorbed or adsorbed from the surrounding environment, causing deterioration and decay of the skeletal remains and odors. Additionally, there is a problem in that the skeletal remains are destroyed by pest invasion.

To solve these problems, a technology of turning ashes into relics or jewelry by additionally processing the ashes so that the stability thereof is improved while providing aesthetic values and storage properties to keep the ashes of the deceased or dead companion animals has been proposed. However, there are many cases in existing processes of turning the ashes into relics where direct firing methods using gas or methods using plasma are commonly used. In the case of these methods, gravel-type relics are formed using the characteristic of being acidified when melting the ashes using high temperatures of 1,800° C. to 2,200° C. and properties of quenchers having a high melting point. On the contrary, in this case, the ashes are inevitably damaged by oxidation caused by the direct firing methods and volatilization occurring during the process using high temperatures. Additionally, there is a problem in that the ashes are likely to be deteriorated after being turned into relics. In addition, in the case of existing technologies of turning the ashes into jewelry, a process of extracting only specific elements from the ashes to be mixed with rubies and sapphires or extracting carbon to create artificial diamonds has been proposed. However, despite outstanding aesthetic functionality in terms of appearance, there is a significant difference between these technologies and the funeral customs of the East, which values the preservation of remains, because only a few elements, compared to the entire amount of the ashes, are used as raw materials. As a result, there has been a problem in that the fundamental purpose of these technologies has failed to be achieved.

PATENT DOCUMENT

Korean Patent No. 10-1516149 (published on May 4, 2015) "BURNER-TYPE DEVICE TO FORM ASHES"

A device to form bead-type crystals by performing heat treatment on the ashes and a method of manufacturing crystals using the same have been disclosed. However, the ashes are subjected to heat treatment at high temperatures of 1,800° C. or higher, so there has been a problem in that volatilization may damage the ashes.

PATENT DOCUMENT

Korean Patent Application Publication No. 10-2013-0082462 (published on Jul. 19, 2013) "METHOD OF STORING CRYSTAL OF CREMATED REMAINS MIXED WITH CHARCOAL COMPOSITION"

Although a method of forming ash crystals having excellent preservative, deodorizing, and antibacterial effects has been disclosed, there has been a problem in that the amount of ashes contained in the ash crystals was small because significant amounts of substances, such as charcoal, ceramics, lapillus, and tourmaline, are added during the formation process.

DISCLOSURE

Technical Problem

The present disclosure has been proposed to solve the problems described above.

A first objective of the present disclosure is to provide a method of forming cremation crystals by using phosphoric acid ($H_3PO_4$) as a catalyst in a heat treatment process of ashes, thus preventing the ashes from being damaged by volatilization and enabling the crystals to be formed more efficiently.

A second objective of the present disclosure is to provide a method of forming cremation crystals, which enables the cremation crystals composed purely of skeletal components by using phosphoric acid ($H_3PO_4$), serving as a catalyst in a heat treatment process of ashes, extracted from the skeletal remains without additionally introducing other additives, thus satisfying the needs of the bereaved or guardians desiring to keep the cremations crystals composed purely of the ashes of the deceased or dead companion animals. Additionally, a third objective of the present disclosure is to provide a more economical method of forming cremation crystals than existing technologies by not requiring additional additives.

A fourth objective of the present disclosure is to provide cremation crystals and a method of forming the same, which enable both the color and transparency of the ultimately formed cremation crystals to be achieved according to the consumer's wishes without limitation, thus satisfying the aesthetic needs of the consumers and being easily applicable to all kinds of jewelry.

A fifth objective of the present disclosure is to provide stable cremation crystals even when stored for a long period of time and a method of forming the same, which prevents corrosion caused by moisture, deterioration resulting from microbial growth, and the like.

On the other hand, other objectives not specified in the present disclosure will be additionally considered within the scope that can be easily inferred from the problem-solving means, effects of the disclosure, and detailed description below.

Technical Solution

To achieve the objectives described above, the present disclosure is implemented by embodiments having the following configuration.

According to a first embodiment of the present disclosure, a method of forming cremation crystals, according to the present disclosure, is characterized by including: mixing ashes and a catalyst to form a mixture; drying the mixture to form a dried product; grinding the dried product to form a ground product; performing a heat treatment process to melt the ground product, thereby forming a melted product; and crystallizing the melted product through cooling to form crystals.

In the method of forming the cremation crystals according to the first embodiment of the present disclosure, the catalyst in the mixing of the ashes and the catalyst is characterized by being phosphoric acid ($H_3PO_4$).

According to a second embodiment of the present disclosure, the method of forming the cremation crystals, according to the present disclosure, further includes: classifying the ashes into raw ashes and ashes for phosphorus extraction; and obtaining the phosphoric acid from the ashes for phosphorus extraction. Additionally, the phosphoric acid, serving as the catalyst, is characterized by being obtained in the obtaining of the phosphoric acid.

In the method of forming the cremation crystals according to the second embodiment of the present disclosure, the mixing of the ashes and the catalyst is characterized in that a second mixture is formed by mixing the raw ashes and the phosphoric acid obtained in the obtaining of the phosphoric acid.

According to a third embodiment of the present disclosure, the method of forming the cremation crystals, according to the present disclosure, further includes: obtaining the phosphoric acid from the ashes; and recovering residual ashes remaining after obtaining the phosphoric acid. Additionally, the mixing of the ashes and the catalyst is characterized in that a third mixture is formed by mixing the residual ashes, recovered in the recovering of the residual ashes, and the phosphoric acid, serving as the catalyst.

In the method of forming the cremation crystals according to the third embodiment of the present disclosure, the phosphoric acid, serving as the catalyst mixed with the residual ashes in the mixing of the ashes and the catalyst, is characterized by being obtained in the obtaining of the phosphoric acid.

In the method of forming the cremation crystals according to the present disclosure, the obtaining of the phosphoric acid is characterized by including: reducing phosphorus from the ashes for extraction; burning the extracted phosphorus to form an oxide through oxidation; and hydrating the oxide by reacting with water to obtain phosphoric acid.

In the method of forming the cremation crystals according to the present disclosure, the mixing of the ashes and the catalyst is characterized in that the phosphoric acid, serving as the catalyst, is mixed in an amount of 100 to 200 parts by weight with respect to 100 parts by weight of the ashes.

In the method of forming the cremation crystals according to the present disclosure, the heat treatment process is characterized by being performed at a temperature of 800° C. to 1250° C. for 10 minutes to 2 hours to melt the ground product.

According to the third embodiment of the present disclosure, the method of forming the cremation crystals, according to the present disclosure, is characterized in that an amount of phosphorus remaining in the residual ashes is controlled to adjust a color and transparency of the ultimately formed cremation crystals.

According to the third embodiment of the present disclosure, the method of forming the cremation crystals, according to the present disclosure, is characterized by including: classifying ashes into raw ashes and ashes for phosphorus extraction; obtaining phosphoric acid ($H_3PO_4$) from the ashes for phosphorus extraction; mixing the raw ashes and the phosphoric acid, serving as a catalyst, obtained in the obtaining of the phosphoric acid to form a second mixture; drying the second mixture to form a dried product; grinding the dried product to form a ground product; performing a heat treatment process to melt the ground product, thereby forming a melted product; and crystallizing the melted product through cooling to form transparent crystals.

Advantageous Effects

The present disclosure has the following effects by employing the technical solution disclosed above.

The present disclosure can provide a method of forming cremation crystals by using phosphoric acid ($H_3PO_4$) as a catalyst in a heat treatment process of ashes, thus preventing the ashes from being damaged by volatilization and enabling the crystals to be formed more efficiently.

The present disclosure can provide a method of forming cremation crystals, which enables the cremation crystals composed purely of skeletal components to be formed by using phosphoric acid ($H_3PO_4$), serving as a catalyst in a heat treatment process of ashes, extracted from the skeletal remains without additionally introducing other additives, thus satisfying the needs of the bereaved or guardians desiring to keep the cremations crystals composed purely of the ashes of the deceased or dead companion animals. Additionally, the present disclosure can provide a more economical method of forming cremation crystals than existing technologies by not requiring additional additives.

The present disclosure can provide cremation crystals and a method of forming the same, which enable both the color and transparency of the cremation crystals to be adjusted through a single formation process to achieve the color and transparency according to the consumer's needs without limitation, thus satisfying the aesthetic needs of consumers and being easily applicable to all kinds of jewelry.

The present disclosure can provide stable cremation crystals even when stored for a long period of time and a method of forming the same, which prevents corrosion caused by moisture, deterioration resulting from microbial growth, and the like.

On the other hand, even effects not expressly mentioned in the present disclosure may be treated as described herein when such effects can be reasonably inferred from the description as a whole, including the detailed description below.

BEST MODE

Hereinafter, a method of forming cremation crystals, according to the present disclosure, will be described in detail with reference to the attached drawings. Unless otherwise defined, all terms including technical and scientific terms used herein have the same meaning as commonly understood by those skilled in the art to which the present disclosure belongs. When terms used herein discord from the commonly understood meaning, the terms will be interpreted as defined herein. In the following description, it is to be noted that, when the functions of conventional elements and the detailed description of elements related to the present disclosure may make the gist of the present disclosure unclear, a detailed description of those elements will be omitted.

Unless otherwise defined, all terms (including technical and scientific terms) used herein may have the same meaning as commonly understood by those skilled in the art to which the present disclosure pertains. Additionally, it will be further understood that terms, such as those defined in commonly used dictionaries, should not be interpreted ideally or excessively unless expressly so defined herein. It will be further understood that unless the context clearly indicates otherwise, the terms "comprises", "comprising", "includes", and/or "including", when used herein, specify the presence of other elements, but do not preclude the presence or addition of other elements.

On the other hand, although ashes typically refer to a material obtained by grinding residues of bone components from the corpse of a vertebrate into powder, the term "ashes" used herein is preferably understood as a material obtained by cremating the deceased, dead companion animals, livestock, and the like and then grinding residues of bone components into powder after cremation.

Figure 1:
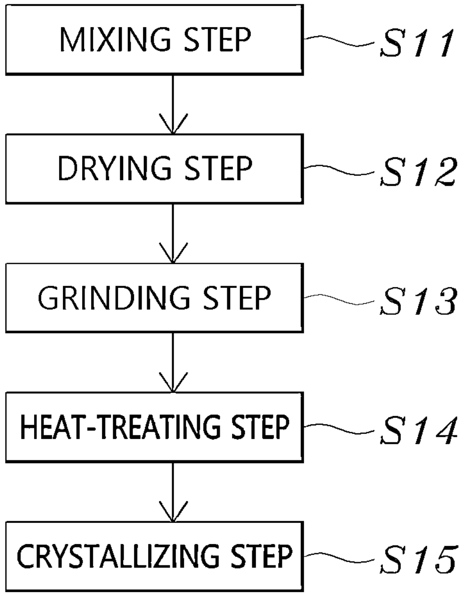
FIG. 1 is a flowchart illustrating a method of forming cremation crystals according to a first embodiment of the present disclosure.

A method of forming cremation crystals, according to a first embodiment of the present disclosure, is to be described with reference to FIG. 1. The method of forming the cremation crystals, according to the first embodiment of the present disclosure, is characterized by including step S11 of mixing ashes and a catalyst to form a mixture, step S12 of drying the mixture to form a dried product, step S13 of grinding the dried product to form a ground product, step S14 of performing a heat treatment process to melt the ground product, thereby forming a melted product, and step S15 of crystallizing the melted product through cooling to form crystals.

Step S11 of mixing the ashes and the catalyst refers to a step of uniformly mixing the ashes with the catalyst to form the mixture, and a mixing method to form the mixture may be applied without particular limitations. For example, in addition to known mechanical mixing methods, such as ball milling, cutter milling, automatic induction, bead milling, jet milling, plate milling, and the like, the mixing may be easily performed manually. To form the mixture in a further pure form, a mixer to which a chemically resistant material, such as quartz or Pyrex, is applied is preferably used. However, the present disclosure is not necessarily limited thereto.

Any catalysts capable of being mixed with the ashes and serving to form a eutectic point lower than the melting point of the ashes may be used as the catalyst. The catalyst preferably means a substance made of a silicon compound, a boron compound, a phosphorus compound, and mixtures thereof, and more preferably means a phosphorus compound selected from the group consisting of metaphosphoric acid ($HPO_3$), pyrophosphoric acid ($H_4P_2O_7$), phosphoric acid ($H_3PO_4$), phosphate compounds thereof, phosphorus pentoxide ($P_4O_{10}$), and mixtures thereof. More preferably, the catalyst means phosphoric acid ($H_3PO_4$). The phosphoric acid may perform a role as a flux to lower the eutectic point in the process of melting the ashes while closely serving to form the crystals by activating phosphorus in the ashes using the property of being crystallized when the concentration thereof increases. Additionally, the phosphoric acid may perform a role in preventing the ashes from being damaged by volatilization caused due to high-temperature conditions, which is one of the main problems occurring during the melting process.

In step S11 of mixing the ashes and the catalyst, the catalyst means the phosphoric acid as described above. The phosphoric acid, serving as the catalyst, preferably means an 85% phosphoric acid aqueous solution and is characterized by being mixed in an amount of 100 to 200 parts by weight with respect to 100 parts by weight of the ashes. The catalyst is preferably mixed in an amount of 100 to 180 parts by weight with respect to 100 parts by weight of the ashes and is more preferably mixed in an amount of 160 parts by weight with respect to 100 parts by weight of the ashes. When the catalyst is mixed in an amount of 100 parts by weight or less with respect to 100 parts by weight of the ashes, there is a problem in that the crystals fail to be formed properly because the ashes insufficiently melt. When the catalyst is mixed in an amount of 200 parts by weight or more with respect to 100 parts by weight of the ashes, the excessive amount of phosphorous causes the melted product to ooze out of the melting mold during the subsequent heat treatment process. Alternatively, the melted product may fail to be released from the melting mold after being crystallized. As a result, the ultimately obtainable crystals may have a plane form, unlike typical forms, causing a problem of deterioration in aesthetical functionality. On the other hand, in step S11 of mixing the ashes and the catalyst, distilled water may be further added in an amount of 20 to 60 parts by weight to 100 parts by weight of the ashes to further facilitate the reaction between the ashes and the catalyst.

In step S12 of drying the mixture, the mixture, uniformly formed in step S11 of mixing the ashes and the catalyst, is dried under high-temperature conditions, preferably at a temperature of 300° C. to 600° C., to form the dried product. However, the mixture is preferably dried by appropriately setting a drying temperature, drying time, or the like according to the condition and amount of the mixture. When the mixture is insufficiently dried or excessively dried than necessary, the shape or transparency of the crystals to be formed later may be affected.

In step S13 of grinding the dried product, the dried product, formed in step S12 of drying the mixture, is ground to form the ground product. The dried product, having been completely dried in step S12 of drying the mixture, is present in a solid form hard like cement and thus must be ground to obtain a small-sized ground product for the melting. Although various known grinding methods may be used as the grinding method used in step S13 of grinding the dried product, one or more methods selected from disk milling, ball milling, or cutter milling may be used to minimize the damage of the ground product by the grinding. Such a formed ground product preferably has a size of 80 to 120 mesh and more preferably has a size of 100 mesh.

In step S14 of performing the heat treatment process, the ground product, formed in step S13 of grinding the dried product, melts through the heat treatment process to form the melted product. In the heat treatment process, the ground product is introduced into a prepared melting mold. Then, the ground product melts through heat treatment. The form of the crystals varies depending on the form of the melting mold, so the form of the melting mold may be selected according to the form of the crystals to be formed. Additionally, the melting mold is preferably made of one or more ceramic materials characterized by being selected from the group consisting of alumina, zirconia, mullite, or quartz, one or more metallic materials among frequently used mold metals, such as platinum or nickel, or graphite. To form the shape of the crystals and to smoothly separate the crystals from the melting mold, the melting mold is more preferably made of graphite.

Any commonly used heat treatment methods may be used as a heat treatment method in the above heat treatment process. However, in terms of economic feasibility, ease of handling, and cost of equipment, a heat treatment method based on a typical electric furnace is preferably used.

The heat treatment process is preferably performed by melting the ground product in the electric furnace under a temperature condition of 800° C. to 1250° C. for 10 minutes to 2 hours. When the heat treatment temperature is lower than 800° C., the ground product may fail to melt properly, making it difficult to form the crystals effectively. When the heat treatment temperature is higher than 1250° C., the ground product may melt relatively effectively. However, there may be a problem of using more energy than necessary, resulting in increased costs. Additionally, there is a problem of separately employing special equipment for high temperatures due to the excessively high temperatures. Furthermore, when the heat treatment time is less than 10 minutes under the heat treatment temperature conditions, the ground product may also fail to melt sufficiently, making it difficult to form the crystals effectively. When the heat treatment time exceeds 2 hours, there may be a problem of using more energy than necessary. Additionally, the melting mold is excessively oxidized, resulting in a problem of deterioration in the quality of the final crystals. Preferably, the heat treatment time is appropriately selected within the above time range depending on the size or form of the crystals to be formed.

The heat treatment process performed is to be described in more detail. The ground product to be melted is introduced into the electric furnace when the temperature inside is in a range of 700° C. to 900° C. Then, the temperature rises to a predetermined target temperature that falls within the heat treatment temperature range. Next, the target temperature is maintained for a predetermined time that falls within the heat treatment time range according to the size and shape of the target crystals to perform the heat treatment process.

In step S15 of crystallizing the melted product, the melted product, having undergone the heat treatment process in step S14 of performing the heat treatment process, is cooled to form the crystals. After completion of the heat treatment process, the temperature inside the electric furnace is lowered. When reaching the discharge temperature by lowering the temperature, the melting mold is taken out of the electric furnace. When the melting mold is taken out of the electric furnace at a low temperature of about 750° C. or lower, there is a problem in that the crystals turn into ceramics. Thus, the discharge temperature is in a range of 750° C. to 950° C., preferably in the range of 800° C. to 900° C.

The method for forming the cremation crystals, according to the first embodiment of the present disclosure, may further include a separation and cleaning step (not shown) after step S15 of crystallizing the melted product. The separation and cleaning step is characterized by additionally cooling the melting mold discharged from the electric furnace, separating the crystals, and removing foreign substances, such as molten mold powder present on the surface of the crystals. In this case, when the crystals are separated from the melting mold while the melting mold is maintained at a temperature of 100° C. or higher, there may be a problem in that the shape of the crystals becomes distorted. Additionally, phenomena such as cracking may occur during the cleaning process. Thus, the crystals are preferably separated from the melting mold while the melting mold is maintained at a temperature in a range of 10 to 100° C. Any cleaning methods may be used without particular limitations. However, to maintain the shape of the crystals and minimize the occurrence of scratches, ultrasonic cleaning is preferably performed.

Figure 2:
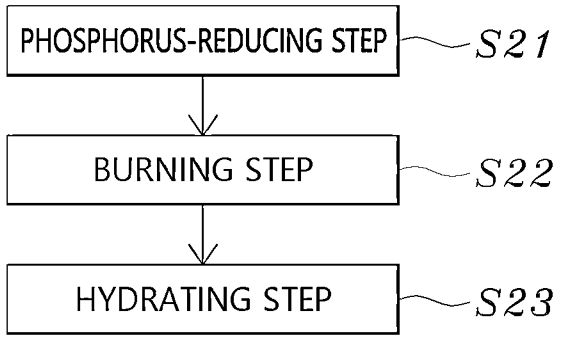
FIG. 2 is a flowchart illustrating a detailed description of a step of obtaining phosphoric acid in a method of forming cremation crystals according to the present disclosure.
Figure 3:
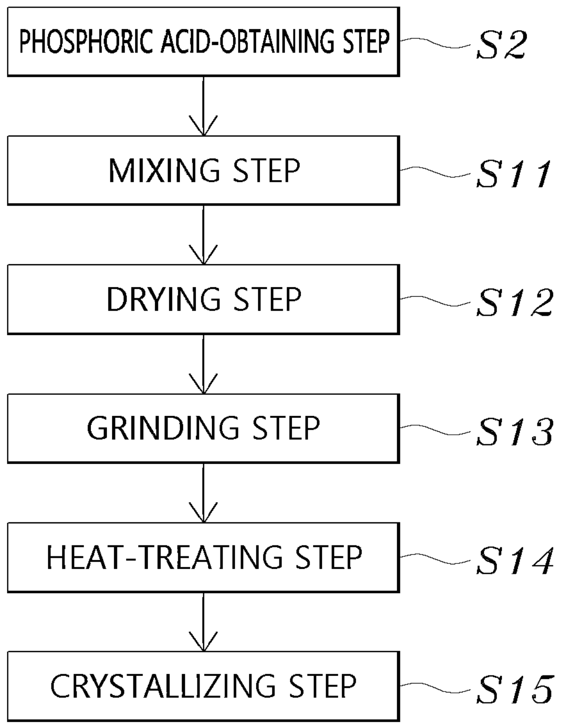
FIG. 3 is a flowchart illustrating the overall steps of a method of forming cremation crystals, including a step of obtaining phosphoric acid.

Hereinafter, step S2 of obtaining the phosphoric acid in the method of forming the cremation crystals, according to the present disclosure, will be described with reference to FIGS. 2 and 3. Step S2 of obtaining the phosphoric acid in the method of forming the cremation crystals, according to the present disclosure, is characterized by including step S21 of reducing phosphorus from the ashes for extraction; step S22 of burning the extracted phosphorus to form an oxide through oxidation; and step S23 of hydrating the oxide by reacting with water to obtain phosphoric acid.

The skeletal remains have some differences depending on the species but are typically known to be composed of 55.82% calcium oxide (CaO), 42.39% phosphorus pentoxide ($P_4O_{10}$), and 1.79% water. Phosphorus (P) has an atomic weight of 30.9738 g/mol, so when calculated based on this, the amount of phosphorus contained in the skeletal remains accounts for approximately 25% to 30% of the total weight. Therefore, the skeletal remains themselves may be an excellent source of phosphorus, and the quality of such obtained phosphorus compounds is not inferior at all compared to that of phosphorus compounds obtained from phosphorites by methods commonly used currently. Therefore, the method of forming the cremation crystals, according to the present disclosure, may further include step S2 of obtaining the phosphoric acid and thus aims to reduce manufacturing costs.

Step S21 of reducing the phosphorus is a step of extracting the phosphorus from the ashes. Although various extraction methods commonly known in the art may be used as the extraction method without particular limitation, the extraction method is preferably characterized in that the phosphorus is reduced and extracted from the ashes by using a tubular electric furnace that enables the gas atmosphere to be created under an inert atmosphere, such as argon or helium, or a reducing atmosphere, such as nitrogen, hydrogen, or carbon dioxide gas to minimize oxidation occurring due to heating.

In step S22 of burning the extracted phosphorus, the phosphorus extracted in step S21 of reducing the phosphorus is burnt and oxidized to form the oxide. The oxide refers to various types of compounds in which phosphorus is oxidized but preferably means phosphorus pentoxide ($P_4O_{10}$). When burnt, phosphorus is oxidized and typically forms phosphorus pentoxide ($P_4O_{10}$). The reaction formula thereof is as follows.

$$P_4+5O_2 \rightarrow P_4O_{10} \quad \text{Reaction Formula 1}$$

Any known burning methods may be used to perform the burning process in step S22 of burning the extracted phosphorus without particular limitation.

In step S23 of hydrating the oxide, the oxide formed in step S22 of burning the extracted phosphorus reacts with water to obtain the phosphoric acid. As mentioned above, the oxide is preferably characterized by referring to phosphorus pentoxide, and when reacting with water, phosphorus pentoxide forms phosphoric acid. The reaction formula thereof is as follows.

$$P_4O_{10}+6H_2O \rightarrow H_3PO_4 \quad \text{Reaction Formula 2}$$

Therefore, to further specifically describe the method of forming the cremation crystals, including step S2 of obtaining phosphoric acid, in a time-series manner, the phosphoric acid is obtained through step S2 of obtaining the phosphoric acid, including step S21 of reducing the phosphorus; step S22 of burning the extracted phosphorus; and step S23 of hydrating the oxide. Additionally, the cremation crystals are characterized by being formed through the method including: step S11 of mixing the ashes and the phosphoric acid obtained in the phosphoric acid-obtaining step; step S12 of drying the mixture to form the dried product; step S13 of grinding the dried product to form the ground product; step S14 of performing the heat treatment process to melt the ground product, thereby forming the melted product; and step S15 of crystallizing the melted product through cooling to form the crystals. Detailed descriptions of step S11 of mixing the ashes and the catalyst, step S12 of drying the mixture, step S13 of grinding the dried product, step S14 of performing the heat treatment process, and step S15 of crystallizing the melted product are the same as those described above and thus will be omitted below.

Figure 4:
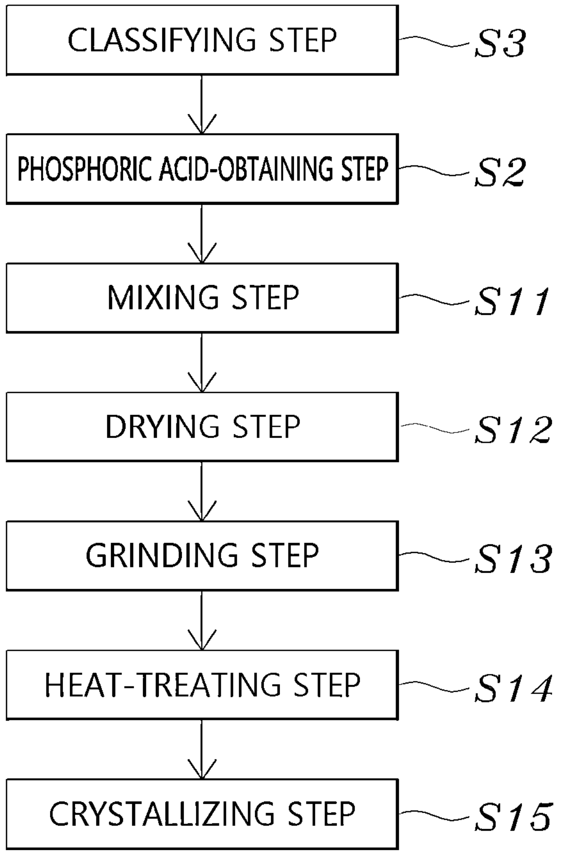
FIG. 4 is a flowchart illustrating a method of forming cremation crystals according to a second embodiment of the present disclosure.

Hereinafter, a method of forming cremation crystals, according to a second embodiment of the present disclosure, will be described with reference to FIG. 4. The method of forming the cremation crystals, according to the second embodiment of the present disclosure, further includes step S3 of classifying ashes into raw ashes and ashes for phosphorus extraction; and step S2 of obtaining phosphoric acid from the ashes for phosphorus extraction. The phosphoric acid, serving as the catalyst in the mixing step, is characterized by being obtained in the phosphoric acid-obtaining step. Furthermore, the mixing step is characterized in that a second mixture is formed by mixing the raw ashes and the phosphoric acid, obtained in the phosphoric acid-obtaining step.

In step S3 of classifying the ashes, before the formation process of the cremation crystals according to the first embodiment of the present disclosure described above, the ashes used to form the cremation crystals are classified into the raw ashes and the ashes for phosphorus extraction. The raw ashes refer to those classified to be used as the ashes to be mixed in step S11 of mixing the ashes and the catalyst after step S3 of classifying the ashes. Preferably, the raw ashes are properly stored until they are used in step S11 of mixing the ashes and the catalyst. Additionally, any storage methods that do not adversely affect the physical or chemical properties of the ashes may be used without particular limitation. On the other hand, the ashes for phosphorus extraction refer to ashes classified to be used as the ashes introduced to obtain the phosphoric acid in step S2 of obtaining the phosphoric acid. A detailed description of the method of obtaining the phosphoric acid from the ashes for phosphorus extraction through a process of reducing the ashes for phosphorus extraction, burning the extracted phosphorus, and hydrating the resulting oxide is the same as that described above and thus will be omitted. On the other hand, the second mixture refers to a mixture obtained by mixing the raw ashes in step S11 of mixing the ashes and the catalyst and the phosphoric acid obtained in step S2 of obtaining the phosphoric acid, as described above.

On the other hand, the mass of the phosphoric acid obtainable from the ashes is almost the same as the mass of the introduced ashes. As mentioned above, the amount of phosphorus contained in the skeletal remains accounts for approximately 25% to 30% of the total weight. Additionally, phosphorus has an atomic weight of 30.9738 g/mol, oxygen (O) has an atomic weight of 15.999 g/mol, and hydrogen (H) has an atomic weight of 1.008 g/mol. Given that one phosphoric acid molecule contains 3 hydrogen atoms, 4 oxygen atoms, and 1 phosphorus atom, a mass ratio of phosphorus in one phosphoric acid molecule, in consideration of each atomic weight of phosphorous, oxygen, and hydrogen, is approximately 31.6%. Thus, a calculation based on this supports that the mass of the ultimately obtained phosphoric acid is almost the same as the mass of the introduced ashes. As described above, based on such matters, the catalyst in step S11 of mixing the ashes and the catalyst, in the method of forming the cremation crystals according to the present disclosure, is preferably mixed in an amount of 100 to 200 parts by weight with respect to 100 parts by weight of the ashes, which is more preferably in the range of 100 to 180 parts by weight of catalyst with respect to 100 parts by weight of the ashes and even more preferably 160 parts by weight with respect to 100 parts by weight of the ashes. Therefore, the ratio of the raw ashes and ashes for phosphorus extraction classified preferably corresponds to the weight ratio described above.

Therefore, to further specifically describe the method of forming the cremation crystals, according to the second embodiment of the present disclosure, in a time-series manner, the ashes are first classified into the raw ashes and the ashes for phosphorus extraction through step S3 of classifying the ashes. Then, the phosphoric acid is obtained through step S2 of obtaining the phosphoric acid, using the ashes for phosphorus extraction. Ultimately, transparent jade or colorless cremation crystals are characterized by being formed through the method including: step S11 of mixing the raw ashes and the obtained phosphoric acid to form the second mixture; step S12 of drying the second mixture to form the dried product; step S13 of grinding the dried product to form the ground product; step S14 of performing the heat treatment process to melt the ground product, thereby forming the melted product; and step S15 of crystallizing the melted product through cooling to form the crystals. Detailed descriptions of step S2 of obtaining the phosphorus acid, step S12 of drying the mixture, step S13 of grinding the dried product, step S14 of performing the heat treatment process, and step S15 of crystallizing the melted product are the same as those described above and thus will be omitted below. In the case of step S11 of mixing the ashes and the catalyst, there is a difference in that the second mixture is formed by mixing the raw ashes and the phosphoric acid obtained through step S2 of obtaining the phosphoric acid. However, since there is no difference from the above-mentioned mixing methods in terms of the detailed mixing method to form the second mixture, the description thereof will also be omitted below.

When forming the cremation crystals, the method of forming the cremation crystals, according to the second embodiment of the present disclosure, enables the cremation crystals to be formed by mixing the raw ashes and the phosphoric acid extracted from the ashes for phosphorus extraction after classifying the ashes into the raw ashes and the ashes for phosphorus extraction. Thus, the method is characterized in that the transparent jade or colorless cremation crystals are enabled to be formed using only the skeletal remains from a single individual without requiring other substances to be added, thus satisfying the needs of families or guardians of the deceased desiring to remember the deceased, dead companion animals, or livestock and to preserve the skeletal remains, and enabling cremation crystals with excellent aesthetic values to be formed.

Figure 5:
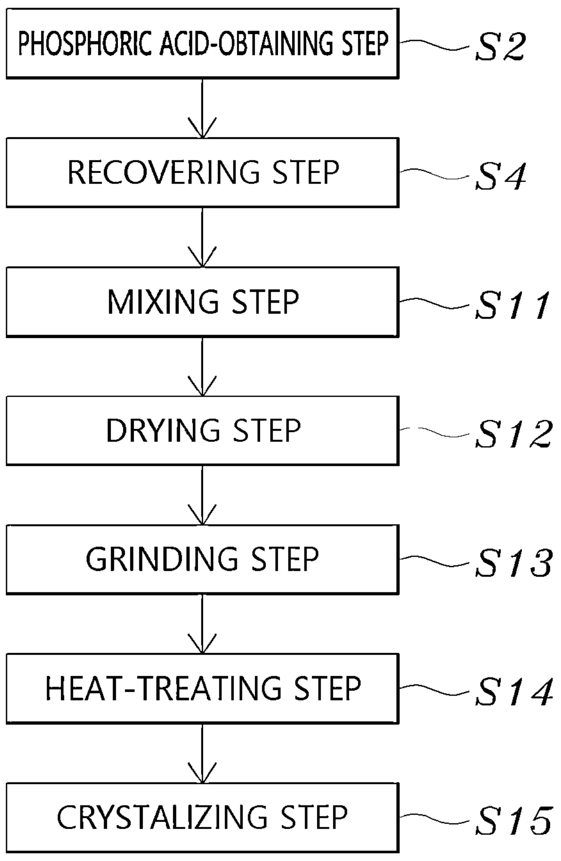
FIG. 5 is a flowchart illustrating a method of forming cremation crystals according to a third embodiment of the present disclosure.

Hereinafter, a method of forming cremation crystals, according to a third embodiment of the present disclosure, will be described with reference to FIG. 5. The method of forming the cremation crystals, according to the third embodiment of the present disclosure, may further include step S4 of recovering residual ashes remaining after step S2 of obtaining the phosphoric acid. Step S11 of mixing the ashes and the catalyst is characterized in that a third mixture is formed by mixing the phosphoric acid, serving as the catalyst, and the residual ashes, recovered in step S4 of recovering the residual ashes. Preferably, the phosphoric acid, serving as the catalyst to be mixed with the residual ashes in step S11 of mixing the ashes and the catalyst, is characterized by being obtained in step S2 of obtaining the phosphoric acid.

In step S4 of recovering the residual ashes, recovered is the residual ashes remaining after extracting the phosphorus component by undergoing step S2 of obtaining the phosphoric acid. On the other hand, in step S11 of mixing the ashes and the catalyst, the third mixture refers to a mixture obtained by mixing the residual ashes and the phosphoric acid, serving as the catalyst or obtained in step S2 of obtaining the phosphoric acid, as described above.

Therefore, to further specifically describe the method of forming the cremation crystals, according to the third embodiment of the present disclosure, in a time-series manner, step S2 of obtaining the phosphoric acid is first performed using the ashes to obtain the phosphoric acid. Then, step S4 of recovering the residual ashes is performed to recover the residual ashes remaining after extracting the phosphorus component through step S2 of obtaining the phosphoric acid. Ultimately, transparent jade or colorless cremation crystals are characterized by being formed through the method including: step S11 of mixing the residual ashes and the phosphoric acid obtained in step S2 of obtaining the phosphoric acid to form the third mixture; step S12 of drying the mixture to form the dried product; step S13 of grinding the dried product to form the ground product; step S14 of performing the heat treatment process to melt the ground product, thereby forming the melted product; and step S15 of crystallizing the melted product through cooling to form the crystals. Detailed descriptions of step S2 of obtaining the phosphorus acid, step S12 of drying the mixture, step S13 of grinding the dried product, step S14 of performing the heat treatment process, and step S15 of crystallizing the melted product are the same as those described above and thus will be omitted below. In the case of step S11 of mixing the ashes and the catalyst, there is a difference in that the third mixture is formed by mixing the residual ashes and the phosphoric acid, serving as the catalyst or obtained through step S2 of obtaining the phosphoric acid. However, the third mixture only differs from the mixture and the second mixture, formed in the mixing step of the method of forming the cremation crystals according to the first or second embodiment of the present disclosure, in components. Since there is no difference from the above-mentioned mixing methods in terms of the detailed mixing method to form the mixture, the description thereof will also be omitted below.

When forming the cremation crystals, the method of forming the cremation crystals, according to the third embodiment of the present disclosure, enables the cremation crystals to be formed by mixing the entire residual ashes and the extracted phosphoric acid after extracting the phosphoric acid from the entire ashes. Thus, the method is characterized in that opaque green or white cremation crystals are enabled to be formed using only the skeletal remains from a single individual without requiring other substances to be added, thus satisfying the fundamental purpose and needs of families or guardians of the deceased desiring to remember the deceased, dead companion animals, or livestock and to preserve the skeletal remains by forming the cremation crystals, and enabling cremation crystals with excellent aesthetic values to be formed. However, the present disclosure is not limited thereto, and it will be apparent to those skilled in the art that various modifications are possible if desired, such as extracting only phosphoric acid from the ashes, followed by extracting phosphoric acid from other individuals, to be mixed with residual ashes.

On the other hand, the cremation crystals formed using the residual ashes remaining after extracting the phosphorus component, according to the method of forming the cremation crystals according to the third embodiment of the present disclosure, has a form in which the color thereof is opaque green or white, unlike the cremation crystals formed using the ashes from which the phosphorus component is not extracted. This is because the composition of the ashes is the same as that described above in the detailed description of the method of forming the cremation crystals according to the second embodiment of the present disclosure, so the residual ashes remaining after extracting the phosphorus component are mostly composed of calcium, oxygen, and hydrogen. Therefore, the third mixture, formed in step S11 of mixing the ashes and the catalyst, using the residual ashes contains less phosphorus than the mixture or the second mixture. In conclusion, the color of the cremation crystals is attributable to the relatively small amount of the phosphorus component in the ultimately formed cremation crystals compared to that in the cremation crystals formed according to the first or second embodiment of the present disclosure described above.

Therefore, the color and transparency of the ultimately formed cremation crystals may be adjusted without limitation by controlling the residual amount of the phosphorus contained. In step S2 of obtaining the phosphoric acid, the phosphorus component is reduced from the ashes through step S21 of reducing the phosphorus. Therefore, the residual amount of the phosphorus contained may be adjusted by controlling the phosphorus reduction process in step S21 of reducing the phosphorus, thereby enabling the color and transparency of the ultimately formed cremation crystals to be achieved without limitation. Any methods of controlling a reduction process applicable to various known extraction methods in the art may be used as the method of controlling the residual amount of the phosphorus contained in the residual ashes without particular limitation. When performing step S21 of reducing the phosphorus using the tubular electric furnace configured to enable the inert or reducing atmosphere to be created without limitation as described above, the residual amount of phosphorus contained in the residual ashes may be adjusted by methods of adjusting the amount of reducing gas introduced to create the reducing atmosphere, the process time of reducing the ashes in the electric furnace, the internal temperature of the electric furnace, or the like.

Hereinafter, preferred embodiments will be presented to aid understanding of the present disclosure. However, the following examples are only provided to more easily understand the present disclosure, and the content of the present disclosure is not limited by the following examples.

Example 1

After stirring 100 mL of a commercially available 85% phosphoric acid aqueous solution per 100 g of pig ashes obtained by being ground into powder after cremation at a high speed of 1000 RPM for 2 minutes to form a mixture, such a formed mixture was dried at a temperature of 450° C. for 20 minutes to form a dried product. Then, the resulting dried product was ground to a size of 100 mesh and then introduced into a melting mold. The melting mold was introduced in an electric furnace at a temperature of 700° C., heated to a temperature of 1000° C. for 1 hour, subjected to heat treatment at the same temperature for 20 minutes, and allowed to be naturally cooled to room temperature after lowering the temperature of the electric furnace to 800° C. Bead-type crystals were separated from the cooled melting mold and then ultrasonically cleaned to obtain transparent jade bead-type crystals.

Example 2

1. After classifying 200 g of pig ashes obtained by being ground into powder after cremation into 85 g of raw ashes and 115 g of ashes for phosphorus extraction, 115 g of the ashes for phosphorus extraction were introduced into an electric furnace at a temperature of 1,350° C. Then, nitrogen and hydrogen gases were added thereto to reduce phosphorus. Such obtained phosphorus was burnt and then reacted with flowing water to obtain about 110 g of liquid phosphoric acid. Next, 25 g of distilled water was added to the liquid phosphoric acid to obtain about 135 g of an 85% phosphoric acid aqueous solution. In the process of obtaining phosphoric acid, residual ashes remaining in the electric furnace after reduction were separated and stored.

Figure 6:
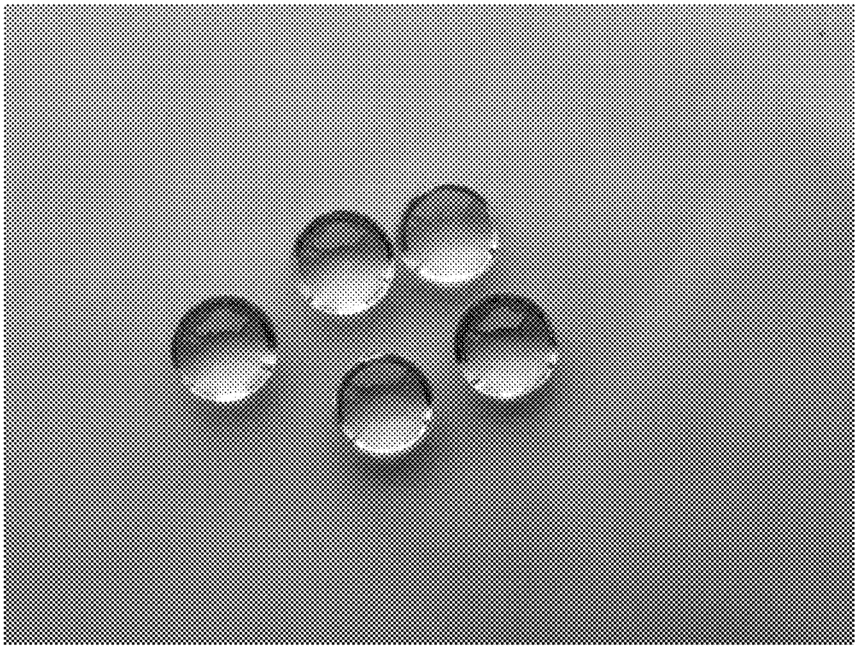
FIG. 6 is an image showing cremation crystals formed by the method of forming the cremation crystals according to the second embodiment of the present disclosure.

2. Transparent jade bead-type single crystals 1, as shown in FIG. 6, were obtained under the same conditions as in Example 1, except for using the separately classified raw ashes in 1 of Example 2 instead of the pig ashes and using the phosphoric acid aqueous solution obtained in 1 of Example 2 instead of the currently available phosphoric acid aqueous solution.

Example 3

Figure 7:
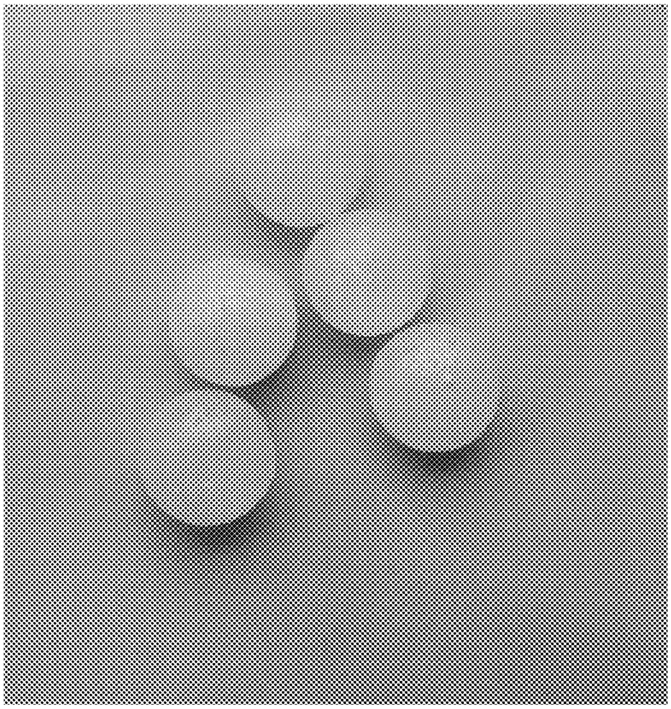
FIG. 7 is an image showing cremation crystals formed by the method of forming the cremation crystals according to the third embodiment of the present disclosure.

Opaque green bead-type single crystals 2, as shown in FIG. 7, were obtained under the same conditions as in Example 1, except for using the separately classified and stored residual ashes in 1 of Example 2 instead of the pig ashes and using the phosphoric acid aqueous solution obtained in 1 of Example 2 instead of the currently available phosphoric acid aqueous solution.

Comparative Example 1

An attempt was made to form crystals under the same conditions as in Example 1, except that the process was started by immediately drying the pig ashes without involving the mixing process of the aqueous phosphoric acid solution with the pig ashes. However, the ground product failed to melt properly, making it impossible to ultimately obtain bead-type cremation crystals.

Comparative Example 2

An attempt was made to form crystals under the same conditions as in Example 1, except that only 50 mL of the phosphoric acid aqueous solution was used instead of 100 mL. However, in this case, the ground product failed to melt properly, making it impossible to ultimately obtain bead-type cremation crystals.

Comparative Example 3

An attempt was made to form crystals under the same conditions as in Example 1, except that 150 mL of the phosphoric acid aqueous solution was used instead of 100 mL. However, in this case, the ground product failed to be properly separated from the melting mold, making it impossible to ultimately obtain bead-type cremation crystals.

Comparative Example 4

An attempt was made to form crystals under the same conditions as in Example 1, except for performing heat treatment at a temperature of 750° C. for 30 minutes. However, in this case, the ground product failed to melt properly, making it impossible to ultimately obtain bead-type cremation crystals.

Although the applicant has described various embodiments of the present disclosure as above, such embodiments are only proposed as one embodiment that implements the technical idea of the present disclosure. Any changes or modifications shall be construed as falling within the scope of the present disclosure so long as they embody the technical ideas of the present disclosure.

The invention claimed is:

1. A method of forming a transparent cremation crystal, the method comprising:

classifying ashes into raw ashes and ashes for phosphorus extraction;

obtaining phosphoric acid ($H_3PO_4$) from the ashes for phosphorus extraction;

mixing the raw ashes and the phosphoric acid, serving as a catalyst, obtained in the obtaining of the phosphoric acid to form a second mixture;

drying the second mixture to form a dried product;

grinding the dried product to form a ground product;

performing a heat treatment process to melt the ground product, thereby forming a melted product;

and crystallizing the melted product through cooling to form the transparent cremation crystal, wherein the transparent cremation crystal is composed purely of ashes' components from a single individual.

* * * * *